United States Patent
Wallichs et al.

(10) Patent No.: US 9,595,308 B1
(45) Date of Patent: Mar. 14, 2017

(54) MULTIPLE-DIE SYNCHRONOUS INSERTION DELAY MEASUREMENT CIRCUIT AND METHODS

(71) Applicant: ALTERA CORPORATION, San Jose, CA (US)

(72) Inventors: Gary Brian Wallichs, San Jose, CA (US); Keith E. Duwel, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/086,931

(22) Filed: Mar. 31, 2016

(51) Int. Cl.
*G11C 7/10* (2006.01)
*G11C 7/22* (2006.01)

(52) U.S. Cl.
CPC ............... *G11C 7/222* (2013.01); *G11C 7/10* (2013.01)

(58) Field of Classification Search
CPC .................................. G11C 7/222; G11C 7/10
See application file for complete search history.

(56) References Cited

U.S. PATENT DOCUMENTS

| | | | |
|---|---|---|---|
| 7,290,162 B2 | 10/2007 | Swarbrick et al. | |
| 7,724,028 B1 | 5/2010 | Ansari et al. | |
| 9,250,859 B2 | 2/2016 | Mendel et al. | |
| 2004/0022099 A1* | 2/2004 | Ozawa | G06F 5/14 365/200 |
| 2004/0130367 A1 | 7/2004 | Swarbrick et al. | |
| 2005/0018514 A1* | 1/2005 | Knaack | G06F 5/06 365/221 |
| 2012/0011484 A1 | 1/2012 | Rao et al. | |

* cited by examiner

*Primary Examiner* — Richard Elms
*Assistant Examiner* — Mohammed A Bashar
(74) *Attorney, Agent, or Firm* — Okamoto & Benedicto LLP

(57) ABSTRACT

Circuitry and methods are disclosed for accurately measuring a latency of a data path through multiple FIFO buffers on separate semiconductor dies. A base latency of each FIFO may be measured by measuring an average occupancy of the FIFO. The base latency of each FIFO may then be adjusted using quantities measured using the circuitry and methods disclosed herein. These quantities may include: the phase delay difference between FIFO read and write clocks; and the insertion delay for the FIFO read clock. Furthermore, an insertion delay difference of the sampling clock between the separate dies may be measured and used to adjust these quantities. Other embodiments and features are also disclosed.

16 Claims, 7 Drawing Sheets

MULTIPLE-DIE SYNCHRONOUS INSERTION DELAY MEASUREMENT CIRCUIT AND METHODS

BACKGROUND

Technical Field

The present invention relates generally to electronic circuits for data communications and other applications.

Description of the Background Art

Several high speed serial protocols, such as the IEEE-1588 standard, the Common Public Radio Interface (CPRI), and PCI Express, require the ability to accurately predict or measure the data bit latency from the package pins to some arbitrary point within a device. Measuring this deterministic latency is needed when synchronization of time is required across different devices in a system or across different systems.

A first-in first-out (FIFO) buffer is commonly used in circuits for data communications and other applications. A write pointer (write counter) is typically used to point to the address in the FIFO buffer where the next word is to be written. Similarly, a read pointer (read counter) is typically used to point to the address in the FIFO buffer from which the next word to be read is obtained.

SUMMARY

Circuitry and methods are disclosed for accurately measuring a latency of a data path through multiple FIFO buffers on separate semiconductor dies. A base latency of each FIFO may be measured by measuring an average occupancy of the FIFO. The base latency of each FIFO may then be adjusted using quantities measured using the circuitry and methods disclosed herein. These quantities may include: the phase delay difference between FIFO read and write clocks; and the insertion delay for the FIFO read clock. Furthermore, an insertion delay difference of the sampling clock between the separate dies may be measured and used to adjust these quantities.

An exemplary circuit includes a first FIFO buffer and first and second observation circuits on a first semiconductor die. The first and second observation circuits sample, respectively, the write and read clock signals for the first FIFO buffer. The delay difference between the first and second observed clock signals provides a measurement of a phase delay difference between the first read and write clock signals.

The exemplary circuit may further include a second FIFO buffer and third and fourth observation circuits on a second semiconductor die. The third and fourth observation circuits sample, respectively, the write and read clock signals for the second FIFO buffer. The delay difference between the third and fourth observed clock signals provides a measurement of a phase delay difference between the second read and write clock signals.

The exemplary circuit may include further observation circuits that may be utilized to measure further quantities. These quantities may be used to adjust the base latencies to obtain more accurate latencies for the data path.

DETAILED DESCRIPTION

Introduction

Consider a three-dimensional (3D) device that has multiple dies which are stacked or otherwise arranged within a package. In such a device, dual-clock first-in first-out (DCFIFO) buffers on the separate dies may be utilized to reliably transfer data across the interconnect between the dies.

It may be desired to accurately determine a latency for the data path across the two dies. An accurate measure of the latency may be needed, for example, to generate an accurate timestamp of a data packet.

One technique for determining the average latency across a single DCFIFO buffer is taught by U.S. Pat. No. 9,250,859, entitled "Deterministic FIFO Buffer," by inventors David W. Mendel and Dana How (Mendel and How). The technique determines the average latency across a DCFIFO buffer by measuring an average occupancy of the DCFIFO buffer. The average occupancy may be measured by: sampling a highest-order bit from the write and read counters; generating an XOR output signal applying an exclusive-or (XOR) to the sampled signals; determining a proportion (fraction) of the XOR output signal that is high; and determining an average occupancy level by multiplying the proportion by the DCFIFO depth.

However, as taught herein, in the case where the data path crosses two DCFIFO buffers on separate dies, the technique of Mendel and How may be insufficient. This is because there is a certain amount of uncertainty introduced by the phase relationships due to the relative clock insertion delays of the clock signals for the FIFO pointers. In other words, accurately and precisely measuring the latency through a DCFIFO requires knowing, not only the relationship between the read and write pointers, but also the relative clock insertion delays.

Figure 1:
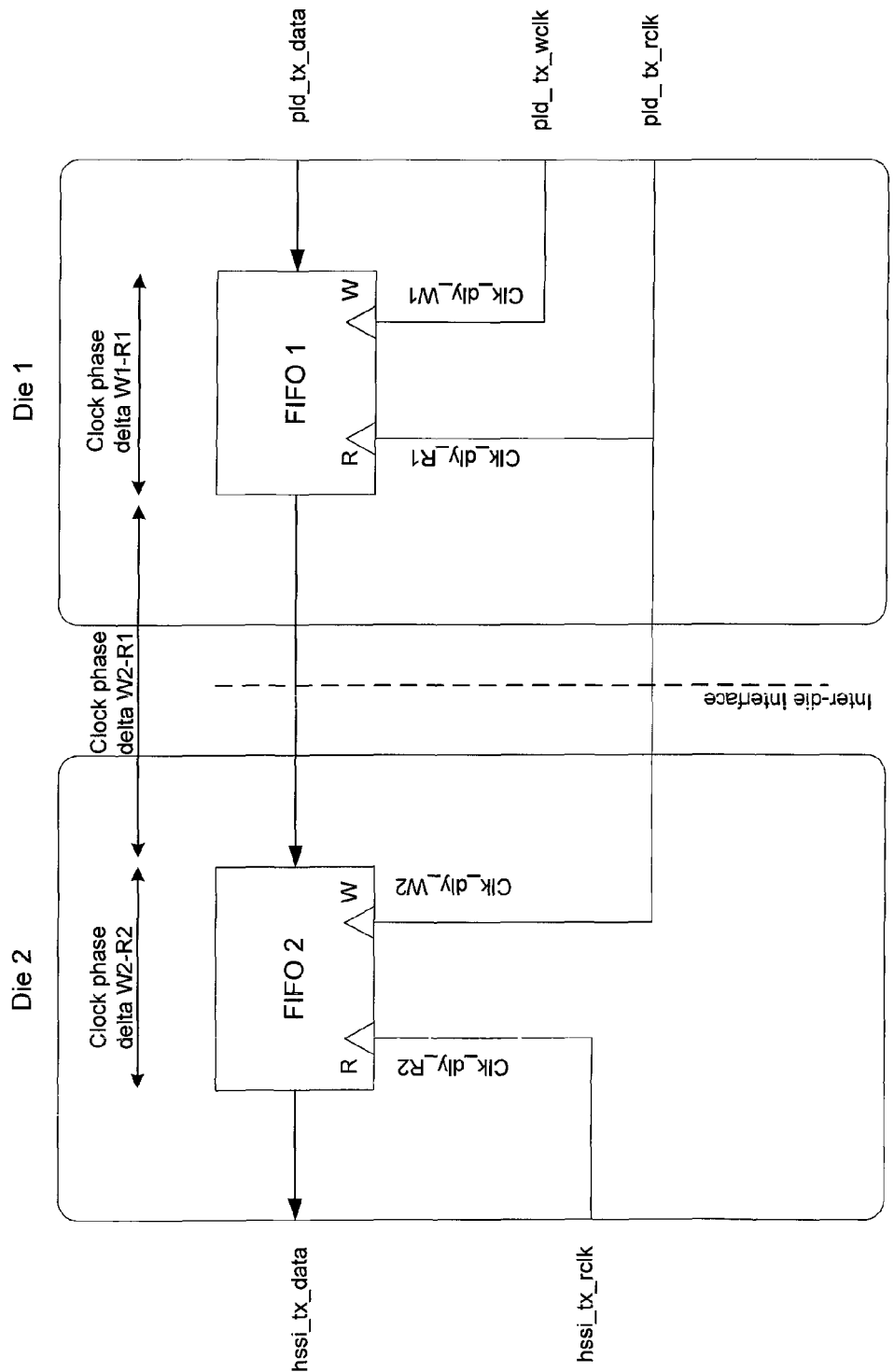
FIG. 1 depicts FIFO buffers used to transfer data from one die to another die in a device.

For example, consider the transmit path across two separate dies depicted in FIG. 1. As shown, the transmit path crosses a first DCFIFO buffer (FIFO 1) on a first semiconductor die (Die 1) and a second DCFIFO buffer (FIFO 2) on a second semiconductor die (Die 2).

As depicted, the clock input for the write pointer for FIFO 1 receives a first write clock signal (pld_tx_wclk) with a clock insertion delay (relative to the input on Die 1) of Clk_dly_W1, and the clock input for the read pointer for FIFO 1 receives a first read clock signal (pld_tx_rclk) with a clock insertion delay (relative to the input on Die 1) of Clk_dly_R1. In an exemplary implementation, the first write and read clock signals (pld_tx_wclk and pld_tx_rclk) may be obtained from core logic circuitry of a programmable logic device (PLD), such as a field programmable gate array (FPGA), for example.

The first read clock signal is forwarded from Die 1 across the inter-die interface to Die 2. The forwarded clock signal is used as a second write clock signal that is applied to the clock input for the write pointer for FIFO 2. The second write clock signal has a clock insertion delay (relative to the input on Die 1) of Clk_dly_W2.

The clock input for the read pointer for FIFO 2 may receive a third clock signal (hssi_tx_rd_clk) with a clock insertion delay (relative to the input on Die 2) of Clk_dly_R2. In an exemplary implementation, the third clock signal (hssi_tx_rd_clk) may be obtained from high-speed serial interface (HSSI) circuitry of the PLD, for example.

As is shown in FIG. 1, the four clock insertion delays (Clk_dly_W1, Clk_dly_R1, Clk_dly_W2, and Clk_dly_R2) may each be different from each other.

The phase relationship due to the relative clock insertion delays of the clock signals for the write and read pointers for FIFO 1 is determined by the difference between Clk_dly_W1 and Clk_dly_R1. This difference may be described as clock phase delta W1-R1.

Similarly, the phase relationship due to the relative clock insertion delays of the clock signals for the write and read pointers for FIFO 2 is determined by the difference between Clk_dly_W2 and Clk_dly_R2. This difference may be described as clock phase delta W2-R2.

Finally, the phase relationship due to the relative clock insertion delays of the clock signals for the read pointer of FIFO 1 and the write pointer of FIFO 2 is determined by the difference between Clk_dly_W2 and Clk_dly_R1. This difference may be described as clock phase delta W2-R1.

The present disclosure provides an innovative technique for measuring the phase relationships due to the relative clock insertion delays of the clock signals for the DCFIFO pointers. The technique uses flip-flop circuits to simplify the physical design burdens associated with balancing combinatorial delays within a place-and-route (PnR) circuit block.

Exemplary Circuit Apparatus and Methods

Figure 2:
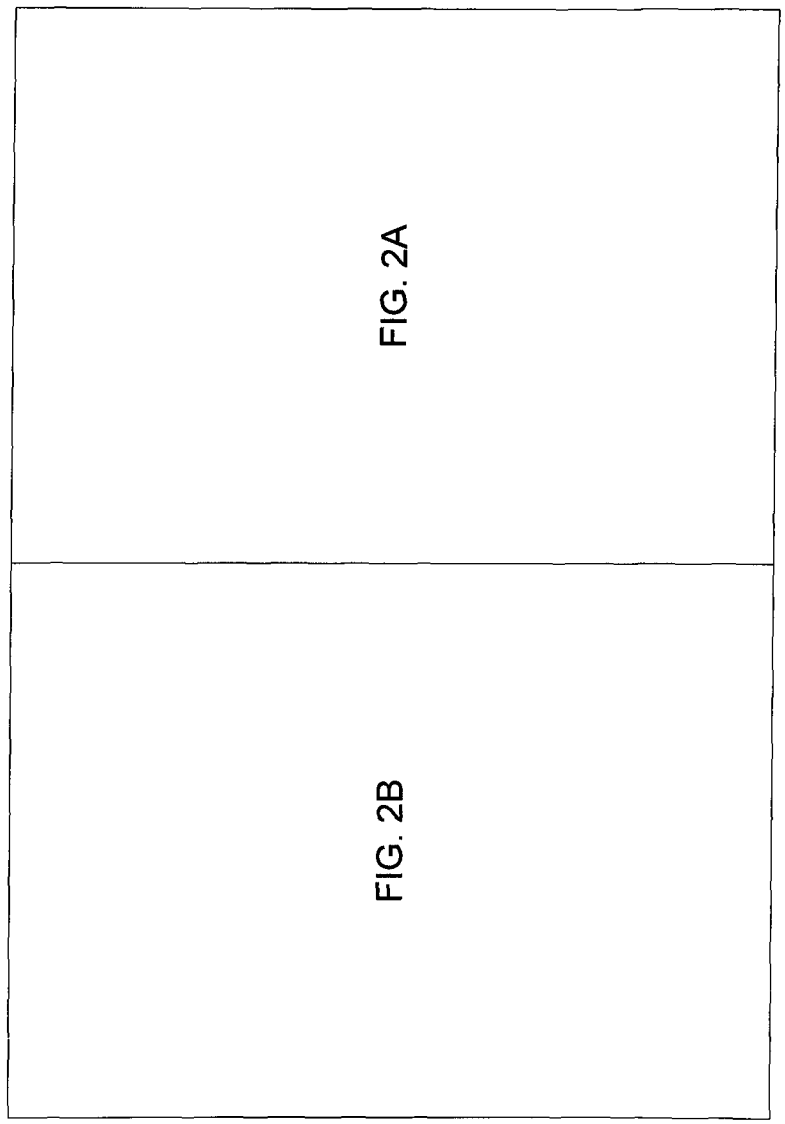
FIG. 2, composed of FIGS. 2A and 2B, depicts an exemplary circuit for multiple-die synchronous insertion delay measurement in accordance with an embodiment of the invention.
Figure 2A:
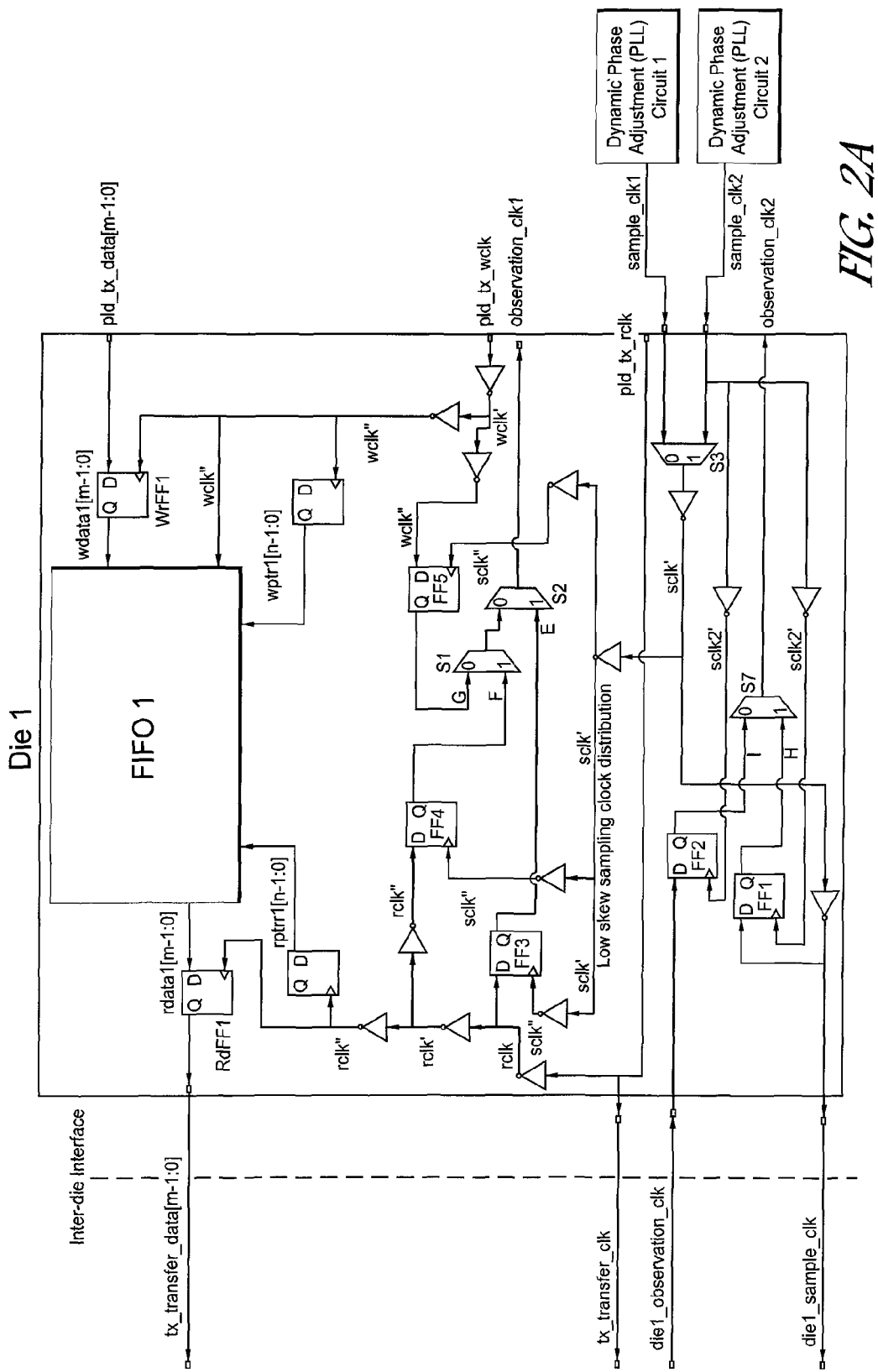
Figure 2B:
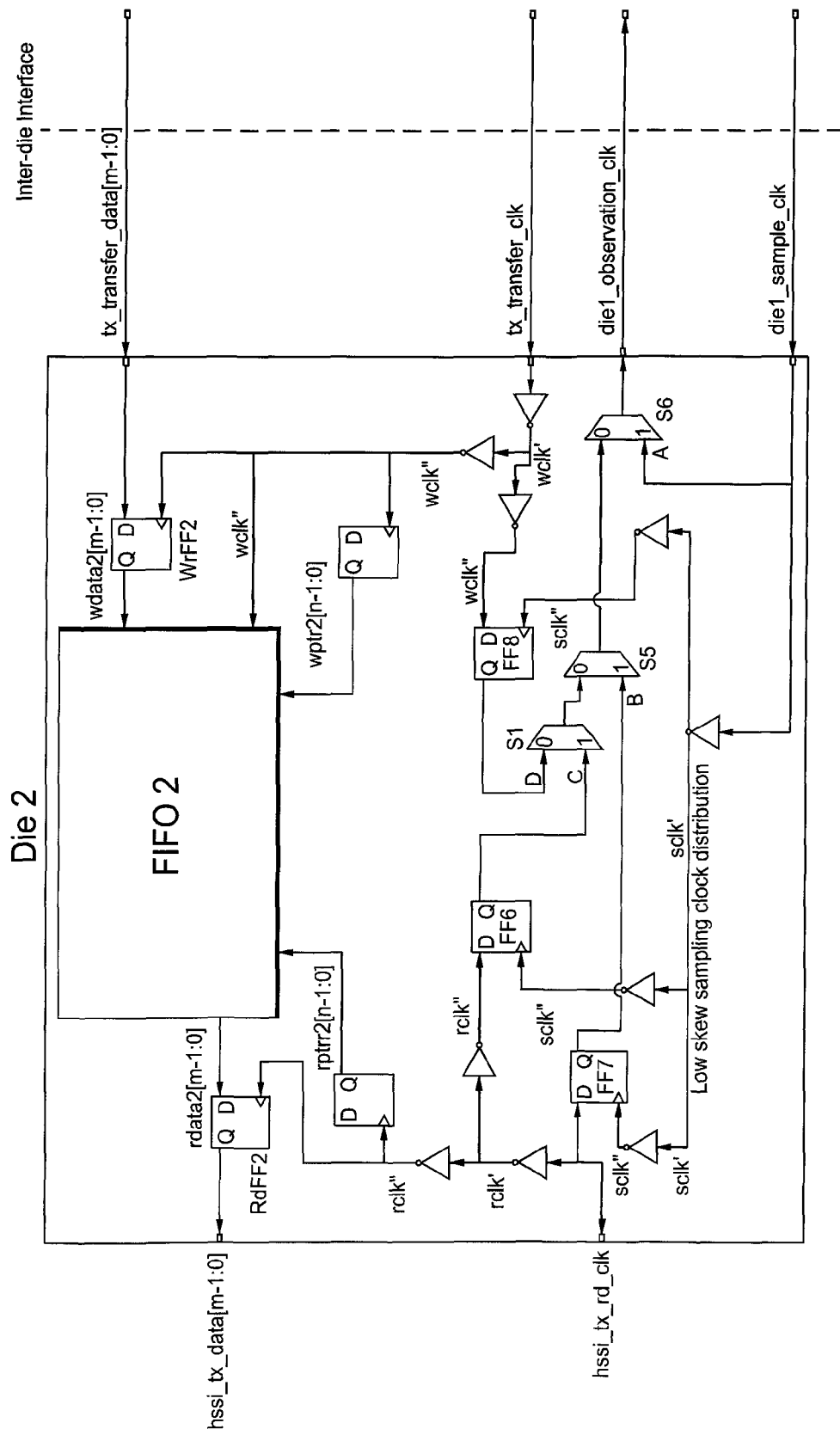

FIG. 2, composed of FIGS. 2A and 2B, depicts an exemplary circuit for multiple-die synchronous insertion delay measurement in accordance with an embodiment of the invention. Circuitry for FIFO 1 on the parent die (Die 1) is depicted in FIG. 2A, while circuitry for FIFO 2 on the daughter die (Die 2) is depicted in FIG. 2B.

As shown in FIG. 2, the measurement circuit has the following features: i) two independent sampling clock inputs (sample_clk1 and sample_clk2); ii) eight observation flip-flop circuits (FF1 through FF8); iii) two observation output pins (observation_clk1 and observation_clk2); and iv) multiplexers (selectors) for viewing nine different observation nodes (node A through node I) onto the two observation output pins. Each of the observation flip-flop circuits FF1-FF8 is advantageously placed close to the branch of the clock tree of the clock that is being observed.

FIFO 1 and FIFO 2

As shown in the detail of FIG. 2A, a data signal being transmitted (pld_tx_data[m−1:0]) is buffered by the first FIFO buffer (FIFO 1) on Die 1 (which may be, for example, a parent or main die). The data signal (wdata1[m−1:0]) being written to FIFO 1 is received via a set of data input flip-flops (WrFF1) that is clocked by the first write clock signal (pld_tx_wclk). The data signal (rdata1[m−1:0]) being read from FIFO 1 is output to a set of data output flip-flops (RdFF1) that is clocked by the first read clock signal (pld_tx_rclk). The output flip-flops provide the data signal (tx_transfer_data[m−1:0]) to the inter-die interface.

FIFO 1 has a write pointer (wptr1[n−1:0]) provided by a set of flip-flops that is clocked by the first write clock signal. FIFO 1 has a read pointer (rptr1[n−1:0]) provided by a set of flip-flops that is clocked by the first read clock signal.

As shown in the detail of FIG. 2B, the data signal received from Die 1 via the inter-die interface (tx_transfer_data[m−1:0]) is buffered by the second FIFO buffer (FIFO 2) on Die 2 (which may be, for example, a child or secondary die). The data signal (wdata2[m−1:0]) being written to FIFO 2 is received via a set of flip-flops (WrFF2) that is clocked by the second write clock signal (tx_transfer_clk) which is a forwarded version of the first read clock (pld_tx_rclk). The data signal (rdata2[m−1:0]) being read from FIFO 2 is output to a set of flip-flops (RdFF2) that is clocked by the second read clock signal (hssi_tx_rd_clk).

FIFO 2 has a write pointer (wptr2[n−1:0]) provided by a set of flip-flops that is clocked by the second write clock signal. FIFO 2 has a read pointer (rptr2[n−1:0]) provided by a set of flip-flops that is clocked by the second read clock signal.

Sampling Clock Signals

Referring to FIG. 2A, the first sampling clock signal (sample_clk1) is a low-skew sampling clock signal that may be generated by a first independent source phase-locked loop (PLL) circuit (Dynamic Phase Adjustment (PLL) Circuit 1) that may be dynamically adjusted with fine granularity phase adjustment controls. For high-accuracy measurement, the first sampling clock signal is preferred to be fully synchronous, with an arbitrary phase offset, relative to the DCFIFO read and write clocks on each die.

The second sampling clock signal is a low-skew sampling clock signal that may be generated by a second independent source PLL (Dynamic Phase Adjustment (PLL) Circuit 2) that may be dynamically adjusted with fine granularity phase adjustment controls. For high-accuracy measurement, the second sampling clock signal should be fully asynchronous and unrelated to the first sampling clock signal.

Distribution of Sampling Clock Signals

Depending on the setting of the selector S3 on Die 1, either the first sampling clock signal (sample_clk1) or the second sampling clock signal (sample_clk2) is selected and distributed (see sclk' and sclk" in FIG. 2A) to clock the observation flip-flop circuits FF3, FF4 and FF5 on Die 1. The sampling clock signal selected by the selector S3 may be referred to as the selected sampling clock signal.

The selected sampling clock signal is also forwarded from Die 1 to Die 2 as the die1_sample_clk signal. The die1_sample_clk signal is distributed on Die 2 (see sclk' and sclk" in FIG. 2B) so as to clock the observation flip-flop circuits FF6, FF7 and FF8.

In addition, the second sampling clock signal (sample_clk2) is distributed (see sclk2' in FIG. 2A) to clock the observation flip-flop circuits FF1 and FF2 on Die 1.

Observation Flip-Flop Circuits

The observation flip-flop circuit FF1 samples the die1_sample_clk signal on Die 1 before it is forwarded to Die 2. As discussed above, the die1_sample_clk signal is the selected sampling clock signal (either sample_clk1 or sample_clk2) from the selector S3.

The observation flip-flop circuit FF2 samples the die1_observation_clk signal that is received by Die 1 from Die 2. Depending on the selling of the selector S6 on Die 2, the die1_observation_clk signal is either the die1_sample_clk signal (node A) or the observed clock signal selected by the selectors S4 and S5 (node B, or node C, or node D).

The observation flip-flop circuit FF5, which is clocked by sclk" that may be selected to be either the first sampling clock signal (sample_clk1) or the second sampling clock signal (sample_clk2), samples the first write clock signal (pld_tx_wclk) and outputs a first sampled write clock signal (at node G).

The observation flip-flop circuit FF4, which is also clocked by sclk" that may be selected to be either the first sampling clock signal (sample_clk1) or the second sampling clock signal (sample_clk2), samples the first read clock signal (pld_tx_rclk) and outputs a first sampled read clock signal (at node F).

The observation flip-flop circuit FF3, which is also clocked by sclk" that may be selected to be either the first sampling clock signal (sample_clk1) or the second sampling clock signal (sample_clk2), also samples the first read clock signal (pld_tx_rclk) and outputs a second sampled read clock signal (at node E).

The observation flip-flop circuits FF3 and FF4 are intended to measure the insertion delay difference of the first read clock between the clock output port (tx_transfer_clk) and the leaf of the internal clock tree (rclk") that is used to clock the read pointer flip-flops (rptr1[n−1:0]). As such, FF3 is placed close to the clock input port, while FF4 is placed close to the read pointer flip-flops. Note that, on Die 1, the delay of the clock at FF3 may either be earlier or later than FF4; however, the relationship will be known and measureable.

The observation flip-flop circuit FF8, which is clocked by sclk" that may be selected to be either the first sampling clock signal (when die1_sample_clk is the forwarded version of sample_clk1) or the second sampling clock signal (when die1_sample_clk is the forwarded version of sample_clk2), samples the second write clock signal (tx_transfer_ck) and outputs a sampled write clock signal for FIFO 2 (at node D).

The observation flip-flop circuit FF6, which is also clocked by sclk" that may be selected to be either the first sampling clock signal (when die1_sample_clk is the forwarded version of sample_clk1) or the second sampling clock signal (when die1_sample_clk is the forwarded version of sample_clk2), samples the second read clock signal (hssi_tx_rd_clk) and outputs a first sampled read clock signal for FIFO 2 (at node C).

The observation flip-flop circuit FF7, which is also clocked by sclk" that may be selected to be either the first sampling clock signal (when die1_sample_clk is the forwarded version of sample_clk1) or the second sampling clock signal (when die1_sample_clk is the forwarded version of sample_clk2), samples the second read clock signal (hssi_tx_rd_clk) and outputs a second sampled read clock signal for FIFO 2 (at node B).

The observation flip-flop circuits FF7 and FF6 are intended to measure the insertion delay difference of the second read clock (the read clock for FIFO 2) between the clock input port (hssi_tx_rd_clk) and the leaf of the internal clock tree (rclk") that is used to clock the read pointer flip-flops (rptr2[n−1:0]). As such, FF7 is placed close to the clock input port, while FF6 is placed close to the read pointer flip-flops.

Observation Outputs

In an exemplary implementation, the first observation clock signal (observation_clk1) and second observation clock signal (observation_clk2) are output from Die 1 to core logic circuitry of a programmable logic device, such as an FPGA.

The first observation clock signal (observation_clk1) is selected by the selector circuit 82 on Die 1. The selector circuit S2 is controlled to select either the second sampled read clock signal for FIFO 1 (node E), or the output of the selector circuit S1. The selector circuit S1 is controlled to select either the first sampled read clock signal for FIFO 1 (node F), or the sampled write clock signal for FIFO 1 (node G). In other words, the selector circuits S1 and S2 are arranged and controlled to select one of the observed clock signals from nodes G, F or E.

The second observation clock signal (observation_clk2) is selected by the selector circuit S7 on Die 1. The selector circuit S7 is controlled to select either the observed clock signal output by the observation flip-flop circuit FF1 (node H), or the observed clock signal output by the observation flip-flop circuit FF2 (node I).

As discussed above, the observation flip-flop circuit FF1 samples the die1_sample_clk signal on Die 1 before it is forwarded to Die 2, where the die1_sample_clk signal is the selected sampling clock signal (either sample_clk1 or sample_clk2) from the selector S3. Meanwhile, the observation flip-flop circuit FF2 samples the die1_observation_clk, which is received from Die 2. Depending on the setting of the selector S6 on Die 2, the die1_observation_clk signal is either the die1_sample_clk signal (node A) or the observed clock signal selected by the selectors S4 and S5 (node B, or node C, or node D).

Insertion Delay Difference of Sampling Clock Between Two Dies

Measuring the delay difference between the observed clock signal at node I (sampled by FF2) and the observed clock signal at node H (sampled by FF1) provides a measurement of the insertion delay difference for the first sampling clock (sample_clk1) between Die 1 and Die 2. Note that such multi-die sampling clock insertion delay differences may be measured to correlate PVT differences in the manufacturing process for the multiple dies. The clock period of the first sampling clock (sampling_clk1) should be slower than the round trip delay of the 3D interconnect to ensure that insertion delay difference is measured accurately. Procedurally, the observed clock signal from node I may be selected by setting S6 to provide the first sampling clock to FF2 and setting S7 to pass the observed clock signal from node I, and then the output phase of the first sampling clock varies relative to the second sampling clock until the edge of the first sampling clock is detected. In addition, the observed clock signal from node H may be selected by setting S7 to pass the observed clock signal from node H, and then the output phase of the first sampling clock varies relative to the second sampling clock until the edge of the first sampling clock is detected. The difference in the number of phase samples to detect the two edges indicates twice (due to the round-trip) the insertion delay difference of the first sampling clock between the two dies.

Insertion Delay of FIFO Read Clock

Measuring the delay difference between the observed clock signal at node E (sampled by FF3) and the observed clock signal at node F (sampled by FF4) provides a measurement of the insertion delay for the FIFO read clock signal (pld_tx_rclk) on Die 1 between the clock input port and the read pointer flip-flops. In particular, the clock insertion delay measured is that of the FIFO read clock between FF3 at a point corresponding to the clock input port (pld_tx_rclk) and FF4 at the leaf of the internal clock tree (rclk" in FIG. 2A) that corresponds to the read pointer flip flops.

Procedurally, the observed clock signal from node E may be selected by setting S2 to pass the signal from node E, and then the output phase of the sampling clock (sample_clk1) varies relative to the FIFO read clock until the edge of the FIFO read clock (at a point corresponding to the clock input port) is detected. In addition, the observed clock signal from node F may be selected by setting S1 and S2 to pass the signal from node F, and the output phase of the sampling clock (sample_clk1) varies relative to the FIFO read clock until the edge of the FIFO read clock (at a point corresponding to the read pointer) is detected. The difference in the number of phase samples to detect the two edges indicates the insertion delay for the FIFO read clock for FIFO 1.

Similarly, measuring a delay difference between the observed clock signal at node B (sampled by FF7) and the observed clock signal at node C (sampled by FF6) provides a measurement of the clock insertion delay for the FIFO read clock signal (hssi_tx_rd_clk) on Die 2 (i.e. for the read clock for FIFO 2) between the clock input port and the read pointer flip-flops. In particular, the clock insertion delay measured is that of the Die 2 FIFO read clock between FF7 at a point corresponding to the clock input port (hssi_tx_rd_clk) and FF6 at the leaf of the internal clock tree (rclk" in FIG. 2B) that corresponds to the read pointer flip flops.

Figure 3:
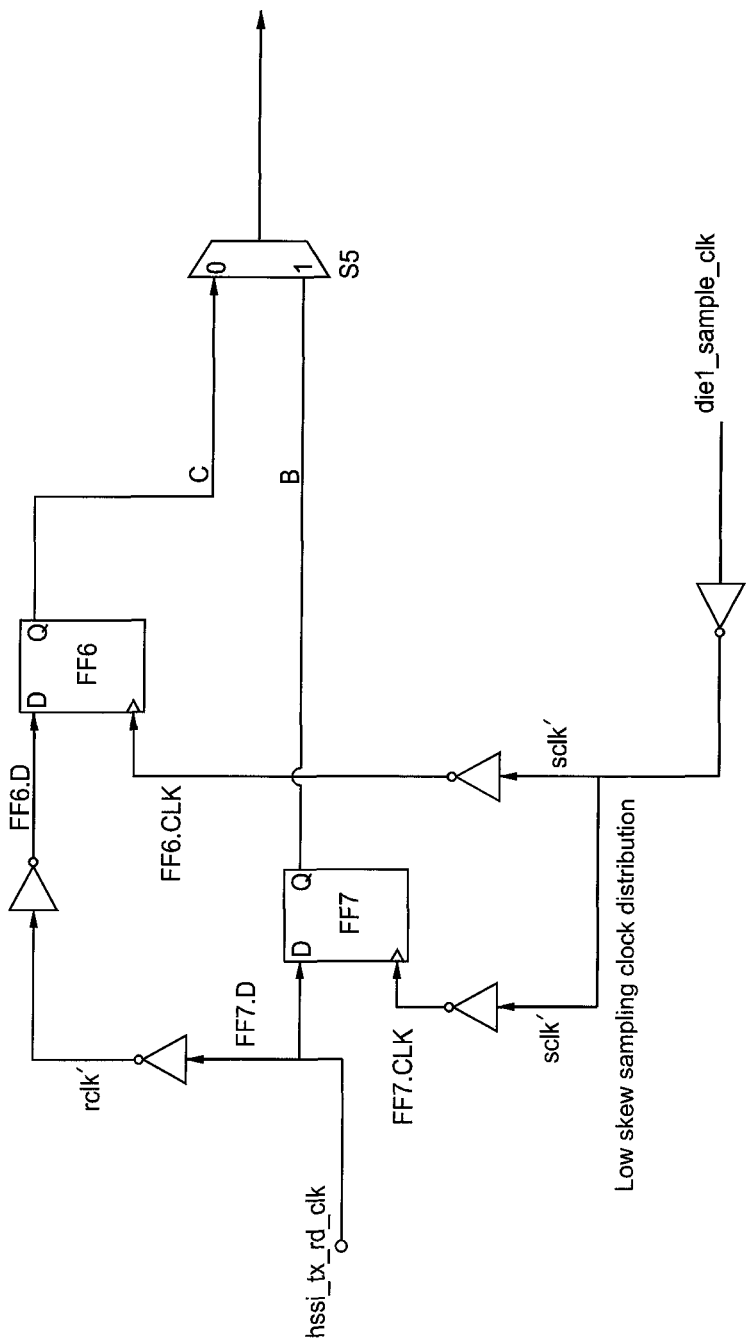
FIG. 3 provides an expanded view of circuitry to measure the insertion delay difference of the read clock for FIFO 2 in accordance with an embodiment of the invention.

FIG. 3 provides an expanded view of circuitry to measure the insertion delay difference of the read clock for FIFO 2 in accordance with an embodiment of the invention. In FIG. 3, the data and clock inputs to FF6 are labeled FF6.D and FF6.CLK, respectively. Similarly, the data and clock inputs to FF7 are labeled FF7.D and FF7.CLK, respectively. The outputs of FF6 and FF7 are labeled C and B, respectively.

Figure 4:
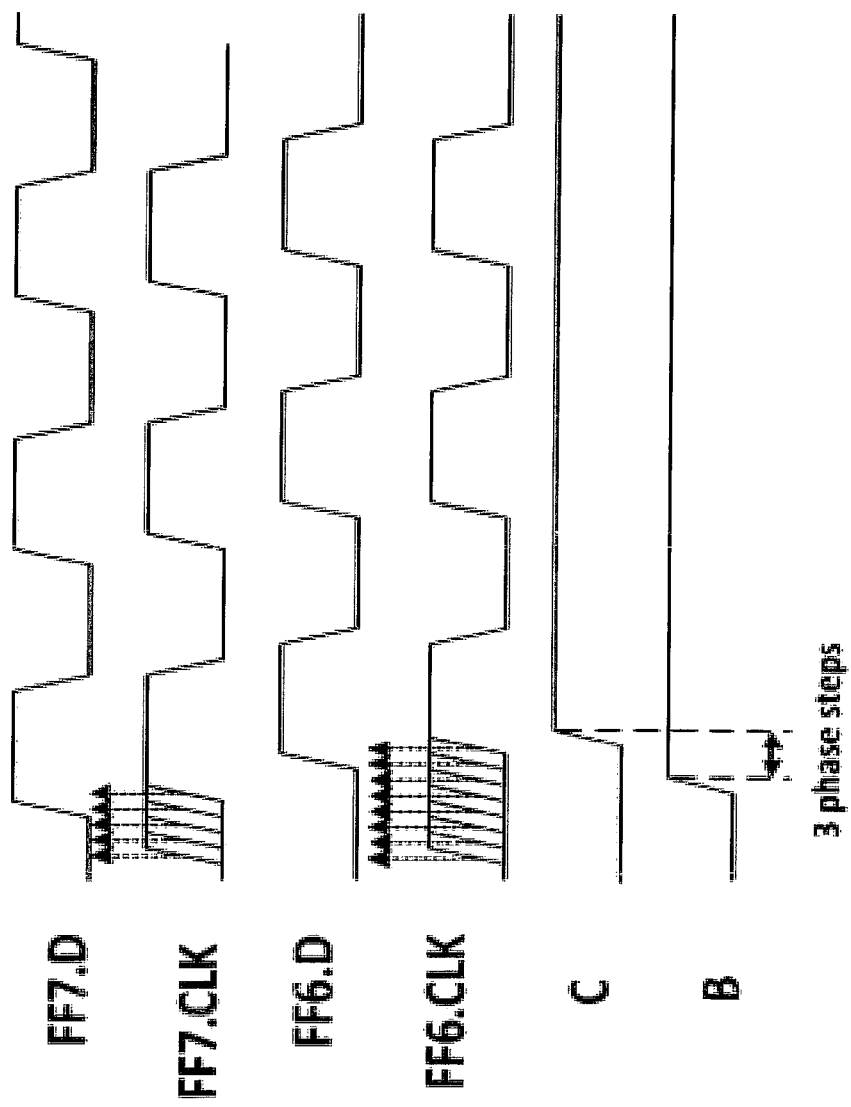
FIG. 4 provides an exemplary timing diagram to measure the insertion delay difference of the read clock for FIFO 2 using the circuitry depicted in FIG. 3 in accordance with an embodiment of the invention.

FIG. 4 provides an exemplary timing diagram to measure the insertion delay difference of the read clock for FIFO 2 using the circuitry depicted in FIG. 3 in accordance with an embodiment of the invention. The timing diagram illustrates the measurement of the insertion delay difference by the phase difference between the outputs of FF6 and FF7 (C and B, respectively).

First, consider the signals relating to FF7 in the mode where S5 is set to select the output signal B. FF7.D shows the read clock at the data input for FF7. FF7.CLK shows the sampling clock at the clock input for FF7. As shown by FF7.CLK, the phase shift for the sampling clock is incremented in steps until the edge of FF7.D is captured by the output signal B.

Second, consider the signals relating to FF6 in the mode where S5 is set to select the output signal C. FF6.D shows the read clock at the data input for FF6. FF6.CLK shows the sampling clock at the clock input for FF6. As shown by FF6.CLK, the phase shift for the sampling clock is incremented in steps until the edge of FF6.D is captured by the output signal C.

By comparing the output signals B and C, it may be determined by the control logic that there are a certain number of phase steps between the edges in B and C. In the example shown, the number of phase steps is three. This difference in phase between B and C indicates the insertion delay difference of the read signal for FIFO 2.

Phase Delay Difference Between FIFO Write and Read Clocks

Measuring a delay difference between the first (node G) and second (node F) observed clock signals (from FF5 and FF4, respectively) provides a measurement of the phase delay difference of the write and read clocks for FIFO 1. The phase delay difference measured is that between welk" at FF5 which is positioned at the leaf of the internal clock tree that corresponds to clock the write pointer flip flops, and rclk" at FF4 which is positioned at the leaf of the internal clock tree that is used to clock the read pointer flip flops.

Procedurally, the observed clock signal from node G may be selected by setting S1 and S2 to pass the signal from node G, and then the output phase of the sampling clock (sample_clk1) varies relative to the FIFO write clock until the edge of the FIFO write clock is detected. In addition, the observed clock signal from node F may be selected by setting S1 and S2 to pass the signal from node F, and the output phase of the sampling clock (sample_clk1) varies relative to the FIFO read clock until the edge of the FIFO read clock is detected. The difference in the number of phase samples to detect the two edges indicates the phase delay difference between the FIFO write and read clocks for FIFO 1.

Similarly, measuring a delay difference between the third (node D) and fourth (node C) observed clock signals (from FF8 and FF6, respectively) provides a measurement of the phase delay difference of the write and read clocks for FIFO 2. The phase delay difference measured is that between wclk" at FF8 which is positioned at the leaf of the internal clock tree that corresponds to clock the write pointer flip flops, and rclk" at FF6 which is positioned at the leaf of the internal clock tree that is used to clock the read pointer flip flops.

Latency Measurements with Improved Accuracy

Figure 5:
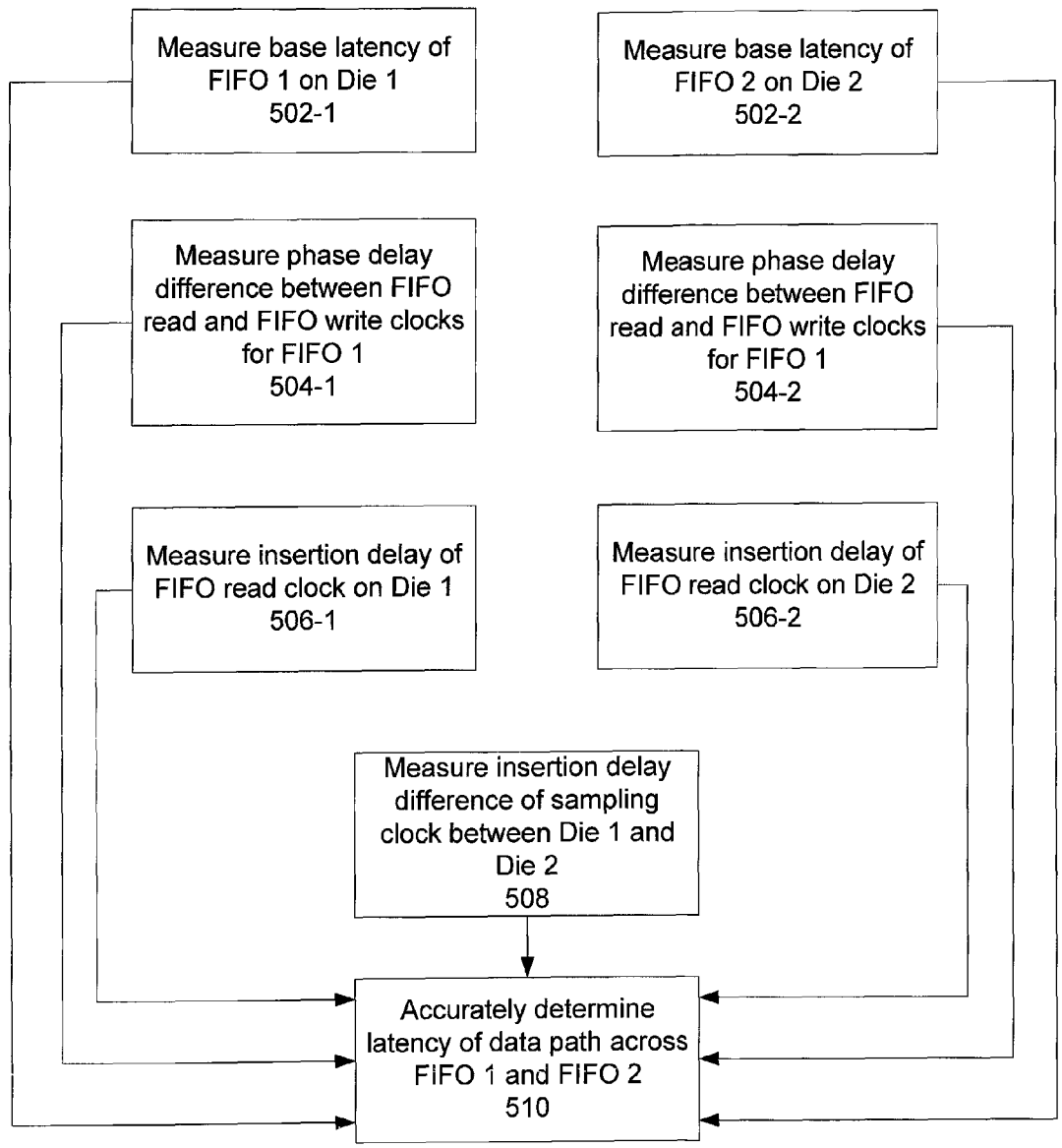
FIG. 5 is a flow chart of a method of accurately determining latency of a data path across two FIFO on two separate dies in accordance with an embodiment of the invention.

FIG. 5 is a flow chart of a method 500 of accurately determining latency of a data path across two FIFOs on two separate dies in accordance with an embodiment of the invention. The two FIFOs may be FIFOs in a transmit data path as described above in detail in relation to FIGS. 1 and 2. Alternatively, the two FIFOs may be RX FIFOs in a receive data path.

Per step 502-1, the base latency of a first FIFO buffer may be measured. Similarly, per step 502-2, the base latency of the second FIFO buffer may be measured. In an exemplary implementation, the base latency of each FIFO buffer may be measured using the technique described in U.S. Pat. No. 9,250,859 to Mendel and How, the disclosure of which is hereby incorporated by reference in its entirety. As disclosed herein, the base latency measurements in steps 502-1 and 502-2 do not take into account clock insertion delays.

Per step 504-1, a phase delay difference between the FIFO write clock and the FIFO read clock of FIFO 1 may be measured. Similarly, per step 504-2, a phase delay difference between the FIFO write clock and the FIFO read clock of the FIFO 2 may be measured. In an exemplary implementation, the phase delay differences may be measured using the circuitry disclosed herein. In particular, as described above, the observed clocks from nodes G and F on Die 1 may be compared to measure the phase delay difference between the FIFO write clock and the FIFO read clock for FIFO 1. Similarly, the observed clocks from nodes D and C on Die 2 may be compared to measure the phase delay difference between the FIFO write clock and the FIFO read clock for FIFO 2.

Per step 506-1, the insertion delay of the FIFO read clock for FIFO 1 may be measured. Similarly, per step 506-2, the insertion delay of the FIFO read clock for FIFO 2 may be measured. In an exemplary implementation, the insertion delay may be measured using the circuitry disclosed herein. In particular, as described above, the observed clocks from nodes F and E on Die 1 may be compared to measure the insertion delay of the FIFO read clock for FIFO 1. Similarly, the observed clocks from nodes C and B on Die 2 may be compared to measure the insertion delay of the FIFO read clock for FIFO 2.

Per step 508, the insertion delay difference of the sampling clock (which is used to obtain the observed clocks in steps 504-1, 504-2, 506-1 and 506-2) between the two dies may be measured. In an exemplary implementation, the insertion delay difference of the sampling clock between the two dies may be measured using the circuitry disclosed herein. In particular, as described above, the observed clocks from nodes I and H may be compared to measure the insertion delay difference of sample_clk1 between Die 1 and Die 2.

Per step 510, an accurate determination may be made of the latency of the data path across the two FIFOs on the separate dies. First, the insertion delay difference for the sampling clock from step 508 may be used to adjust the measured phase delay differences of steps 504-1 and 504-2 and the insertion delays for the FIFO read clocks from steps 506-1 and 506-2. Then, the adjusted phase delay differences and read clock insertion delays may be used to adjust the base latencies measured in steps 502-1 and 502-2. The adjusted latencies of the two FIFOs may then be added together to obtain an accurately-determined latency of the data path across the two FIFOs on the separate dies.

Conclusion

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A circuit comprising:
    a first first-in first-out (FIFO) buffer on a first semiconductor die, wherein a write pointer for the first FIFO buffer is clocked by a first write clock signal, and a read pointer for the first FIFO buffer is clocked by a first read clock signal;
    a first observation circuit that samples the first write clock signal and outputs a first observed clock signal;
    a second observation circuit that samples the first read clock signal and outputs a second observed clock signal;
    a second FIFO buffer on a second semiconductor die, wherein a write pointer for the second FIFO buffer is clocked by a second write clock signal, and a read pointer for the second FIFO buffer is clocked by a second read clock signal;
    a third observation circuit that samples the second write clock signal and outputs a third observed clock signal; and
    a fourth observation circuit that samples the second read clock signal and outputs a fourth observed clock signal,
    wherein the first, second, third and fourth observation circuits are clocked by a first sampling clock signal; and
    a fifth observation circuit clocked by the first sampling clock that samples the first read clock signal and outputs a fifth observed clock signal, wherein the first read clock signal reaches the fifth observation circuit before reaching the second observation circuit.

2. The circuit of claim 1, wherein a delay difference between the first and second observed clock signals provides a measurement of a phase delay difference between the first read and write clock signals.

3. The circuit of claim 1, wherein a delay difference between the third and fourth observed clock signals provides a measurement of a phase delay difference between the second read and write clock signals.

4. The circuit of claim 1, wherein the first sampling clock signal is generated by a first clock generation circuit having a phase adjustment that is dynamically controlled.

5. The circuit of claim 1, further comprising:
    a fifth observation circuit clocked by the first sampling clock that samples the first read clock signal and outputs a fifth observed clock signal,
    wherein the first read clock signal reaches the fifth observation circuit before reaching the second observation circuit.

6. The circuit of claim 5, further comprising:
    selection circuitry for selecting one of the first, second and fifth sampled signals from output as a first observation clock signal.

7. The circuit of claim 5, wherein a delay difference between the fifth and second observed clock signals provides a measurement of a clock insertion delay for the first read clock signal.

8. The circuit of claim 5, further comprising:
    a sixth observation circuit clocked by the first sampling clock that samples the second read clock signal and outputs a sixth observed clock signal,
    wherein the second read clock signal reaches the sixth observation circuit before reaching the fourth observation circuit.

9. The circuit of claim 8, further comprising:
    selection circuitry for selecting one of the third, fourth and sixth sampled signals from output as a second observation clock signal.

10. The circuit of claim 8, wherein a delay difference between the sixth and fourth observed clock signals provides a measurement of a clock insertion delay for the second read clock signal.

11. The circuit of claim 8, further comprising:
    circuitry for a round-trip transfer of the first sampling clock signal from the first semiconductor die to the second semiconductor die and back to the first semiconductor die;
    a seventh observation circuit clocked by a second sampling clock signal for sampling the first sampling clock signal before the round-trip transfer and outputting a seventh observed clock signal; and
    an eighth observation circuit clocked by the second sampling clock signal for sampling the first sampling clock signal after the round-trip transfer and outputting an eighth observed clock signal.

12. The circuit of claim 11, wherein a delay difference between the eighth and seventh observed clock signals provides a measurement of insertion delay difference of the first sampling clock signal between the first and second semiconductor dies.

13. The circuit of claim 11, wherein the second sampling clock signal is generated by a second clock generation circuit having a phase adjustment that is dynamically controlled.

14. The circuit of claim 13, wherein the first sampling clock signal is synchronous, with an arbitrary phase offset, relative to said read and write clock signals.

15. The circuit of claim 13, wherein the first and second sampling clock signals are asynchronous relative to each other.

16. The circuit of claim 1, wherein each said observation circuit comprises a observation flip-flop circuit.

* * * * *